United States Patent
Busche et al.

(10) Patent No.: US 10,008,394 B2
(45) Date of Patent: Jun. 26, 2018

(54) METHOD FOR MOUNTING AN ELECTRICAL COMPONENT, WHEREIN A HOOD IS USED, AND HOOD SUITABLE FOR USE IN SAID METHOD

(71) Applicant: Siemens Aktiengesellschaft, Munich (DE)

(72) Inventors: Nora Busche, Berlin (DE); Joerg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days. days.

(21) Appl. No.: 15/301,787

(22) PCT Filed: Mar. 30, 2015

(86) PCT No.: PCT/EP2015/056867
§ 371 (c)(1),
(2) Date: Oct. 4, 2016

(87) PCT Pub. No.: WO2015/150311
PCT Pub. Date: Oct. 8, 2015

(65) Prior Publication Data
US 2017/0117162 A1  Apr. 27, 2017

(30) Foreign Application Priority Data
Apr. 4, 2014 (DE) .......... 10 2014 206 608

(51) Int. Cl.
*H01L 23/495* (2006.01)
*H01L 21/56* (2006.01)
(Continued)

(52) U.S. Cl.
CPC .............. *H01L 21/56* (2013.01); *H01L 23/13* (2013.01); *H01L 23/367* (2013.01); *H01L 23/46* (2013.01); *H01L 23/495* (2013.01)

(58) Field of Classification Search
CPC ....... H01L 23/495; H01L 23/13; H01L 23/46; H01L 23/367
See application file for complete search history.

(56) References Cited

U.S. PATENT DOCUMENTS 5,929,516 A   7/1999   Heerman et al. ............. 257/701
5,986,334 A   11/1999  Lee ............................... 257/667
(Continued)

FOREIGN PATENT DOCUMENTS

CN   102496612 A   6/2012   ........... H01L 23/552
CN   102738131 A   10/2012  ............ H01L 21/56
(Continued)

OTHER PUBLICATIONS

Kandasamy, Ravi et al., "Application of Phase Change Materials in Thermal Management of Electronics," Applied Thermal Engineering, No. 27, pp. 2822-2832 (11 pages), dated Jan. 10, 2007.
(Continued)

*Primary Examiner* — Kyoung Lee
*Assistant Examiner* — Christina Sylvia
(74) *Attorney, Agent, or Firm* — Slayden Grubert Beard PLLC

(57) ABSTRACT

A method for mounting an electrical component to a substrate may include mounting the component onto the substrate, forming a cover including a thermally softenable or hardenable material and a contacting structure defined by integrated conductor paths, mounting the cover onto a mounting side of the substrate and onto the component mounted on the substrate, such that (a) the cover laterally traverses the component, (b) first contact surfaces of the
(Continued)

contacting structure engage with the substrate at a first joining level defined at the mounting side of the substrate, and (c) second contact surfaces of the contacting structure engage with the component at a second joining level at the top side of the component, the second joining level being different than the first joining level. After assembling the components, joining connections at the first and second joining levels may be completed by a temperature or pressure based joining process.

12 Claims, 2 Drawing Sheets

(51) Int. Cl.
*H01L 23/367* (2006.01)
*H01L 23/46* (2006.01)
*H01L 23/13* (2006.01)

(56) References Cited

U.S. PATENT DOCUMENTS

| | | | |
|---|---|---|---|
| 6,207,475 B1 * | 3/2001 | Lin | H01L 21/563 257/778 |
| 6,340,842 B1 | 1/2002 | Nakamura | 257/724 |
| 6,538,322 B2 | 3/2003 | Nakamura | 257/723 |
| 6,812,559 B2 | 11/2004 | Palm et al. | 257/691 |
| 7,468,548 B2 | 12/2008 | Wu et al. | 257/675 |
| 7,525,187 B2 | 4/2009 | Speckels et al. | 257/688 |
| 7,893,514 B2 | 2/2011 | Kwon et al. | 257/433 |
| 8,201,326 B2 | 6/2012 | Ewe et al. | 29/832 |
| 8,253,229 B2 | 8/2012 | Yamano et al. | 257/686 |
| 8,975,117 B2 | 3/2015 | Otremba et al. | 438/118 |
| 2007/0262470 A1 | 11/2007 | Ichiryu et al. | 257/783 |
| 2008/0017409 A1 | 1/2008 | Takeuchi et al. | 174/260 |
| 2008/0076209 A1 | 3/2008 | Klink et al. | 438/112 |
| 2009/0321912 A1 * | 12/2009 | Watanabe | H01L 21/561 257/686 |
| 2011/0266666 A1 | 11/2011 | Maeda et al. | 257/698 |
| 2012/0018895 A1 | 1/2012 | Oganesian et al. | 257/773 |
| 2012/0020026 A1 | 1/2012 | Oganesian et al. | 361/707 |
| 2012/0074592 A1 * | 3/2012 | Luan | H01L 25/16 257/777 |
| 2012/0106109 A1 | 5/2012 | Kim et al. | 361/771 |
| 2013/0015544 A1 | 1/2013 | Han et al. | 257/428 |
| 2013/0056844 A1 | 3/2013 | Oganesian | 257/443 |
| 2013/0201631 A1 | 8/2013 | Parker et al. | 361/728 |
| 2014/0008811 A1 * | 1/2014 | Yap | H01L 23/49861 257/774 |

FOREIGN PATENT DOCUMENTS

| | | | |
|---|---|---|---|
| CN | 202495439 U | 10/2012 | H01L 23/32 |
| DE | 10062108 A1 | 6/2002 | H01L 23/373 |
| DE | 102007047698 A1 | 4/2008 | H01L 21/58 |
| DE | 102007036045 A1 | 2/2009 | H01L 21/52 |
| DE | 102007057346 B3 | 6/2009 | H01L 23/04 |
| DE | 102009059236 A1 | 7/2010 | H01L 21/58 |
| DE | 102009016112 A1 | 10/2010 | H01L 23/488 |
| DE | 102013101258 A1 | 8/2013 | H01L 21/603 |
| JP | 2003031724 A | 1/2003 | H01L 23/12 |
| JP | 2006352080 A | 12/2006 | H01L 25/07 |
| JP | 2007324550 A | 12/2007 | H01L 23/12 |
| JP | 2010206142 A | 9/2010 | H01L 21/60 |
| JP | 2011228631 A | 11/2011 | H01L 23/12 |
| JP | 2014011236 A | 1/2014 | H01L 21/60 |
| WO | 96/09646 A1 | 3/1996 | H01L 21/60 |
| WO | 2015/150311 A1 | 10/2015 | H01L 23/00 |
| WO | 2015/150335 A1 | 10/2015 | H01L 21/50 |

OTHER PUBLICATIONS

Bachnak, Nouhad, "3D-MID Technology MEMS Connectivity and System Level," IEEE Electronics Pacakaging Technology Conference, pp. 572-576 (5 pages), 2012.
Psota, Boleslav et al., "Usage of LTCC Technology in Electronic Packaging," 36th Int. Spring Seminar on Electronics Technology, IEEE, pp. 206-209 (4 pages), 2013.
German Search Report, Application No. 102014206601.8, 8 pages, dated Aug. 22, 2014.
German Search Report, Application No. 102014206608.5, 8 pages, dated Aug. 22, 2014.
International Search Report and Written Opinion, Application No. PCT/EP2015/056912, 16 pages, dated Jul. 7, 2015.
International Search Report and Written Opinion, Application No. PCT/EP2015/056867, 21 pages, dated Jul. 7, 2015.
U.S. Non-Final Office Action, U.S. Appl. No. 15/301,772, 14 pages, dated Jan. 27, 2017.
U.S. Final Office Action, U.S. Appl. No. 15/301,772, 16 pages, dated Jul. 28, 2017.
U.S. Non-Final Office Action, U.S. Appl. No. 15/301,772, 15 pages, dated Nov. 20, 2017.
Japanese Office Action, Application No. 2017503061, 5 pages, dated Sep. 19, 2017.
Chinese Office Action, Application No. 201580018035.0, 7 pages, dated Feb. 2, 2018
Japanese Office Action, Application No. 2017503064, 10 pages, dated Jan. 29, 2018.
Chinese Office Action, Application No. 201580018036.5, 7 pages, dated Feb. 2, 2018.

* cited by examiner

METHOD FOR MOUNTING AN ELECTRICAL COMPONENT, WHEREIN A HOOD IS USED, AND HOOD SUITABLE FOR USE IN SAID METHOD

CROSS-REFERENCE TO RELATED APPLICATIONS

This application is a U.S. National Stage application of International Application No. PCT/EP2015/056867 filed Mar. 30, 2015, which designates the United States of America, and claims priority to DE Application No, 10 2014 206 608.5 filed Apr. 4, 2014, the contents of which are hereby incorporated by reference in their entirety.

TECHNICAL FIELD

The invention relates to a method for mounting an electrical component on a substrate, wherein the component has a bottom side facing toward the substrate and has a top side situated opposite said bottom side. In the method, the bottom side of the component is mechanically connected to the assembly provided by the substrate. The top side of the component is then mechanically connected to a contacting structure. Here, the joining connections that are formed during the joining process are situated in at least two different joining levels.

BACKGROUND

The invention also relates to a cover for an electrical assembly, wherein the assembly has a substrate and at least one component mounted on said substrate. The cover has a support surface by way of which said cover can be placed onto the substrate. Furthermore, the cover has a cavity in which the component can be received. The component has contact both on its top side and on its bottom side by way of which said component is mounted on the substrate. Said contacts are thus situated at different joining levels.

The joining levels are defined in that, during the mounting on a substrate and during the establishment of contact, the contact of electronic components are situated on different planes, wherein here, the expression plane is meant in the technical sense rather than the mathematical sense. A plane, or the associated joining level, defines regions in which certain electrical or other mechanical connections of the components to be contacted are situated. By way of the arrangement of components one above the other, the joining levels are preferably likewise situated one above the other, in particular in a parallel orientation with respect to one another.

Methods for the mounting of electronic components on substrates are known. Said mounting methods are also used in the mounting of electronic assemblies in the power electronics field. For example, DE 100 62 108 A1 describes that a power module can be formed in the case of which the electronic power components can be connected to the substrate by way of a sintered layer. The substrate may involve DCB (direct copper bond) ceramic substrates such as are commonly used in the power electronics field. The top sides of the power components could be connected by way of a sintered layer to, for example, an additional thermal capacity, which provides a cooling body. Likewise, the substrate may, by way of its bottom side, be connected by way of a sintered layer to a further cooling body.

From DE 10 2007 047 698 A1, it is known that sintered connections of electronic assemblies can be manufactured with the aid of special tools. Said tools have pressure surfaces which make contact with the component parts to be sintered, such that, during the sintering treatment, a pressure can be exerted on said components. By way of tolerance compensation in the tool, it can be ensured that the applied pressure is uniform even if the assembly to be sintered has tolerance-induced manufacturing inaccuracies. During the sintering treatment, in addition to the pressure build-up, it is necessary for a certain sintering temperature to be attained over a defined period of time. It is also possible for soldered connections to be provided instead of sintered connections.

According to US 2013/0201631 A1, it must be ensured that the temperatures required for the sintering process are selected such that joining connections that have already been produced in the assembly are not melted again by the heat treatment presently taking place. This is achieved in that the component connections already formed before the respective connecting process have connecting materials whose process temperatures (softening temperature, sintering temperature, melting temperature) lie, with a sufficient safety margin, above those process temperatures of the connecting process presently taking place. In this way, the joining connections that have already been formed are not put at risk, in terms of their integrity, by the connecting process presently taking place.

After the components have been mounted on the substrate, it is generally also necessary for contacting of said components to the substrate to be realized by way of suitable contacting structures. Here, contacts situated on the top side of the component are connected to corresponding contacts on the substrate. For this purpose, aside from the generally known bonding wires, it is also possible, as per US 2012/0106109 A1, for use to be made of metallic conductive structures which may for example be part of a leadframe. The suitably bent conductive structures are preferably connected to the respective contact surfaces by way of sintering or soldering. Another possibility consists in providing the contacting structures by way of flexible foils onto which the conductive structure is printed, for example. The flexible foils may also be connected, as per DE 10 2009 016 112 A1, to the respective contact surfaces of the top side of the component and to the mounting side of the substrate by way of sintered connections.

Owing to the levels of electrical power implemented in power electronics structures, the power electronics assemblies are subjected to high thermal and electrical load, as a result of which the electrical connections and other joining connections must exhibit high reliability. Sintered connections in particular are particularly suitable for this purpose because their thermal stability, and flawless formation of the joining connection, can be ensured. However, the mounting of power electronics assemblies by way of sintered connections presently entails a certain amount of additional outlay in terms of manufacture, for example in relation to soldering.

SUMMARY

One embodiment provides a method for mounting an electrical component on a substrate, wherein the component has a bottom side facing toward the substrate and has a top side situated opposite said bottom side, the bottom side of the component is mechanically connected to the assembly provided by the substrate, the top side of the component and the mounting side of the substrate are mechanically connected by way of a contacting structure, wherein the joining connections that are formed during the joining process are situated in at least two different joining levels, wherein the contacting structure is integrated, in the form of conductor paths, into a cover, wherein the cover is composed of a thermally softenable or thermally hardenable material, wherein the cover, during the mounting process, is placed onto the mounting side of the substrate, traverses the component, contact surfaces of the contacting structure enter into engagement with the substrate within a first joining level which is provided by the mounting side of the substrate, and on the inner side of the cover, contact surfaces of the contacting structure enter into engagement with the component within a second joining level at the level of the top side of the component, and wherein the material of the cover is, during the mounting process, heated at least into the softening range or into the hardening range while the joining connections on the contact surfaces of the contacting structure are completed.

In one embodiment, the substrate, the component and the cover are assembled before joining connections on the component in the first joining level and in the second joining level are completed in one and the same working step by way of a temperature increase or a temperature and pressure increase.

In one embodiment, the softening or hardening of the cover and the completion of the joining connections are performed in one and the same working step under the same conditions.

In one embodiment, the substrate, by way of its rear side which is averted from the mounting side and which provides a third joining level, is assembled with a component part before a connection between the component part and the substrate is completed in the working step in which the joining connections on the component in the first joining level and in the second joining level are also completed.

In one embodiment, the cover has, on the outside, a planar surface which runs parallel to the substrate.

In one embodiment, a prepreg is used as hardenable material.

In one embodiment, a phase change material is used as thermally softenable material.

In one embodiment, the phase change material is enclosed in an encapsulation.

Another embodiment provides a cover for an electrical assembly which has a substrate and at least one component mounted on said substrate, wherein the cover has a support surface by way of which said cover can be placed onto the substrate, has a cavity in which the component can be received, wherein a contacting structure is integrated, in the form of conductor paths, into a cover, wherein the cover is composed of a thermally softenable or thermally hardenable material and the contacting structure has, on the inner side of the cover, in the region of the support surface in the cavity, contact surfaces for the substrate and the component.

In one embodiment, the cover is of sandwich type of construction, wherein both the thermally softenable or thermally hardenable material and the contacting structure form layers in the sandwich.

In one embodiment, an additional material is applied, in the cover, to the contact surfaces of the contact structure.

In one embodiment, the support surface is formed by an edge of the cover.

In one embodiment, the outer side of the cover is planar.

BRIEF DESCRIPTION OF THE DRAWINGS

Example aspects and embodiments of the invention are described below with reference to the drawings, in which.

DETAILED DESCRIPTION

Figure 1:
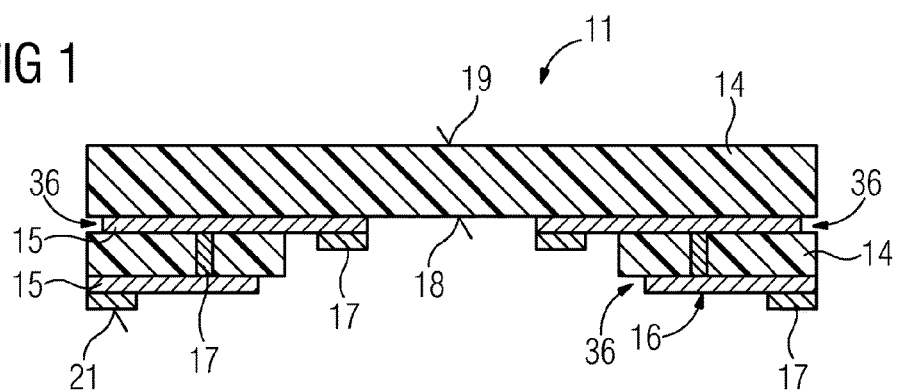
FIG. 1 shows an exemplary embodiment of the cover according to the invention in a schematic cross section, wherein said embodiment also constitutes the first step of an exemplary embodiment of the method according to the invention.

Some embodiments of the invention specify a method for mounting an electrical component on a substrate, wherein said method is simplified and also permits the mounting of power electronics components. Furthermore, it is the object to specify a cover of the type mentioned in the introduction which can be used in said improved method.

Some embodiments provide a method in which the contacting structure is integrated, in the form of conductor paths, into a cover. Said cover is produced from a thermally softenable or thermally hardenable material. During the mounting, the cover is firstly placed onto the mounting side of the substrate. Here, the cover traverses the component (or multiple components). The contact surfaces of the contacting structure with the substrate lie in this case within a first joining level which is provided by the mounting side of the substrate. The substrate is connected in electrically conductive fashion to said contact surfaces. On the inner side of the cover there are situated further contact surfaces of the contacting structure, wherein said further contact surfaces enter into engagement, within a second joining level at the height of the top side of the component, with contacts of the components situated there. In this way, the contacting structure produces an electrical connection between the contact surfaces on the substrate and the contact surfaces on the top side of the component, wherein the two joining levels are bridged.

In some embodiments, the material of the cover may, during the mounting process, be heated at least into the softening range (in the case of the cover being composed of a thermally softenable material) or into the hardening range (in the case of the cover being composed of a thermally hardenable material). This has the advantage that the material of the cover is plastically deformable within certain limits during the mounting process. If tolerances arise during the mounting process, these can thus be reliably bridged. This reduces the required mounting accuracy and increases the admissible manufacturing tolerances of the joining partners. Therefore, the mounting process is advantageously simplified.

The softening range or the hardening range is characterized by a temperature range in which the softening takes place to the extent admissible for the mounting process, or the hardening of the material takes place. During the mounting process, that is to say the placing of the cover onto the substrate, it is necessary to ensure corresponding temperature control in the mounting process in order that the plastically deformable behavior of the cover is generated.

In one embodiment, it is provided that the substrate, the component and the cover with the contacting structure are firstly positioned relative to one another in the configuration to be produced. Only thereafter is it intended to complete the joining connections, in particular electrical connections, on the component within the at least two joining levels in one and the same working step by way of a temperature increase or a temperature and pressure increase. In other words, according to the invention, it is provided that the method for mounting the electronic assembly on the substrate is intended to take place in two defined process segments. In the first process segment, all of the component parts, which are to be mounted, of the assembly provided by the substrate are positioned relative to one another. Here, it is also the case that the joining connections are formed, though these are not yet completed. In the second manufacturing phase, the joining connections are completed. For this purpose, it is necessary to use a suitable joining method, wherein, depending on the type of mechanical connections to be produced, a temperature increase (for example in the case of soldering) or a temperature and pressure increase (for example in the case of diffusion soldering or in the case of sintering) is necessary. It is advantageously provided that said joining connections can be produced in one working step. For this purpose, it is necessary for all of the joining connections to be produced to be configured for the process parameters set during said single working step. Here, a certain temperature level is reached. Furthermore, it is additionally possible for a pressure to be exerted at least on part of the connections. The respectively selected connection type, and any additional material required, need not necessarily be exactly the same in the case of all joining connections. It is essential merely that the process parameters in the case of all connection types and materials are coordinated with one another and, in this way, the simultaneous formation of all joining connections in one working step is possible.

By way of the simultaneous formation of all joining connections, it may be advantageous for contacting structures to be mounted whose in particular electrical connections are situated on different joining levels. Here, said joining levels can be bridged without the need for an additional working step for forming the joining connections. This is advantageously realized by virtue of the bottom side of the component being situated within a first joining level, which is provided by a mounting side of the substrate, and the top side of the component being situated within a second joining level. The first joining level is defined by the plane that is normally provided by the substrate. The group of electrical connections by way of which in each case the bottom side of the electrical components on the substrate is contacted lies on said plane (which in the case of non-planar substrates, such as for example housings, need not imperatively be planar in the mathematical sense). The top side of the components then defines, if said top side has electrical contact surfaces, a second joining level which is spaced apart from the first joining level by the spatial height extent of the electrical components. By way of different heights of the electrical components, it may be the case that the second joining level does not lie in a plane, wherein the sum of all contact surfaces on the respective top side of components defines said joining level.

If multiple electrical components are stacked one on top of the other, it is accordingly the case, in each "tier" of the stack, that further joining levels are formed which, during the electrical connection, must possibly be bridged by way of corresponding contact structures. The arrangement of the electrical components such that their contacts can be assigned to in each case different joining levels advantageously facilitates the mounting of the electrical assembly, in the case of which the components and contact structures can be pre-mounted (that is to say positioned relative to one another) level by level, in order for the preferably electrical connections in all joining levels to then subsequently be produced in one working step.

In a particular embodiment, it is provided that the softening or hardening of the cover and the completion of the joining connections are performed in one and the same working step under the same conditions. Here, it is advantageous if the temperature range of the softening range or hardening range at least overlaps the temperature range for the completion of the joining connections. In this case, for the mounting process, a temperature can be used at which the completion of the joining connections and the hardening or softening of the cover can take place simultaneously. The hardening or softening of the cover and the completion of the joining connections may however also be performed in succession in the same working step.

Furthermore, in some embodiments, the material of the cover must pose a sufficient resistance to a plastic deformation in order that a pressure that may be required in the case of the production of sintered connections or diffusion-soldered connections at the electrical contacts can possibly be dissipated during the completion of the joining connection. Said pressure may be dissipated in that, during the plastic deformation, a component of an elastic deformation is simultaneously generated in the material of the cover. Examples of material pairings for the joining connections on the one hand and for the cover on the other hand which satisfy the above-stated conditions will be specified below.

Sintered Connections:
Silver sinter paste (e.g. Heraeus mAgic Paste, Microbond ASP series) with a temperature range of 200-208° C.

Diffusion-Soldered Connections:
Material system SnCu, SnAg, SnNi and further material systems which can form intermetallic phases with high melting point. Here, different formulations may be used, such as for example
single-paste systems with particles of high melting point (e.g. Cu) dispersed in the base matrix composed of alloys with low melting point (such as SnCu),
two-paste systems with sequential application methods (Cu, with high melting point, followed by SnCu alloy), or
methods for applying the additional material with low melting point (e.g. SnCu alloy) between the boundary surfaces of high melting point (e.g. Cu), wherein the joining zone with high melting point is generated under process conditions by way of diffusive changes in concentration.

Thermally Hardenable Cover Material:
Prepreg material (e.g. Isola Duraver-E-Cu quality 104 ML) with a temperature maximum of 230° C.

Thermally Softenable Cover Material:
Examples here are thermoplastic materials such as polyethylene terephthalates (PET), modified polyether ether ketones (PEEK) (in the case of elevated joining temperatures), polyamides and polyphthalamides (PPA).

In a further embodiment, the substrate, by way of its rear side which is averted from the mounting side, may provide a contact surface by way of which a third joining level is provided. A component part is positioned within said joining level. Subsequently, in the manner according to the invention, a connection between the component part and the substrate is completed, by way of a temperature increase or a temperature and pressure increase, in precisely that working step in which the joining connections on the electrical component in the first joining level and in the second joining level (and possibly further joining levels) are also completed. A further simplification of the mounting process is advantageously possible in this way. The greater the number of different joining levels that can be incorporated in one working step during the manufacture of the connections, the greater the extent to which the mounting process is simplified, which ultimately also has an advantageous effect on the profitability of said process.

The component part that is mounted on the rear side of the substrate may for example be a cooling body which serves, in the case of power electronics assemblies, for a dissipation of heat losses. Said cooling body may also be in the form of a main body, wherein said main body is provided for the common mounting of multiple electronic assemblies. Another possibility consists in the substrate being populated with electrical components on both sides. In this case, it would for example be possible for cooling to be realized by way of cooling ducts in the substrate.

In a particular embodiment, all of the joining connections may be completed by way of one and the same joining method. As already mentioned, it is likewise possible for different joining methods to be selected for the individual joining connections. However, it is necessary to satisfy the condition that the different selected joining methods can be performed under the predefined process conditions (pressure, temperature). In particular, the temperature must be constant over the entire electrical assembly to be mounted. The pressure may vary, for example as a result of multiple joining tools being used or by virtue of a joining tool being provided in the case of which, for example by way of spring mechanisms with different spring stiffness, different manufacturing pressures are applied to different components of the structure to be joined. Said conditions also apply in the situation in which all of the joining connections are completed by way of one and the same joining method. It is particularly advantageously also possible, in the case of the selected joining method (in particular diffusion soldering or sintering), for the same additional material to be selected, such that the manufacturing conditions for the joining method are uniform for the entire assembly. It is however also possible for different additional materials to be selected, if these can be completed under the predefined joining conditions in the manner discussed above.

In another embodiment, aside from the joining connections, the connection between the component part (for example the cooling body) and the substrate (on the rear side) may also be completed by way of the selected joining method. In this way, the discussed advantages can also be extended to the joining of the connection between the component part and the substrate, which can be completed in one working step together with the joining connections on the mounting side of the substrate. It is self-evidently also possible for the connections on the rear side of the substrate to be electrical connections if the component part that is mounted there is an electrical component part.

In one embodiment, diffusion soldering or sintering is used as a joining method. These methods may be advantageously suitable, for example, if it is sought to mount power electronics, because the connections formed have a low defect density and exhibit high thermal stability. Diffusion soldering has a method procedure similar to sintering. An additional material is introduced into the region between the component parts to be joined, wherein said material, under the action of temperature and possibly elevated pressure, contributes to a diffusion of alloy components of low melting point and of high melting point. By way of these local changes in concentration, intermetallic phases of high melting point are generated in the joining zone and at the boundaries thereof to the adjacent component parts, which intermetallic phases exhibit high temperature stability. The connection formed exhibits very high electrical and thermal conductivities, and high mechanical strength.

In one embodiment, before the positioning in the configuration to be produced, an additional material may be applied to the substrate and/or to the component and/or to the contacting structure in the cover and/or to the component part. As already mentioned, said additional materials may facilitate the joining, for example the sintering or the diffusion soldering. The connection constituents responsible for the sintering processes or diffusion processes may however also be contained in the contact surfaces for the connection to be formed. In the case of classic soldering, however, it is always the case that a solder material is required as additional material.

In another embodiment, the cover has, on the outside, a planar surface which runs parallel to the substrate. This may provide advantages for the procedure of the mounting method, which is thereby simplified. Specifically, a planar surface makes it possible for a joining tool, by way of which the pressure can be exerted on the assembly to be mounted, to be easily placed on. It is furthermore also possible for the required process heat to be introduced by way of said tool, if said tool is heated. The transmission of the process heat to the components to be joined, in particular the cover, is likewise improved if a planar surface is provided which extends in particular over the entire areal extent of the cover. A further advantage consists in that the joining tool does not need to be geometrically adapted to the cover. The joining tool may be equipped, as standard, with a planar surface for exerting pressure, wherein it is basically possible for covers for different applications, that is to say for example of different size or with different structuring of the inner side, to be mounted using one and the same joining tool.

It may be advantageous if a prepreg is used as hardenable material. Such materials can be obtained as semifinished parts, and in this way, covers of different structure can be manufactured without great manufacturing outlay. Prepregs are to be understood to mean composite materials composed of fibers and of a matrix composed of not yet fully hardened, preferably thermosetting resin. The resin may however be partially hardened in order to improve the mechanical stability and the processing characteristics of the prepreg. Final curing is then performed, as already discussed, during the course of the mounting of the cover.

In some example embodiments, prepregs of Isola Duraver-E-Cu may be used for the production of the cover. These are then suitably cut to size and laid one on top of the other in layers, wherein a layered three-dimensional structure is realized. The contacting structure may likewise be formed from layered material, for example metal foils, or else from a leadframe. Said metallic structures are then integrated into the layered composite and embedded therein by way of the curing of the cover material.

In a further embodiment, a phase change material may be used as thermally softenable material. Phase change materials are to be understood to mean materials whose latent heat of fusion, heat of solution or heat of absorption is higher than the heat that said materials can store owing to their specific thermal capacity, that is to say without a phase change effect. Said materials are selected, with regard to their phase change characteristics, such that said phase change is realized during the planned operation of the electronic assembly at least in certain operating states. In this way, it can be ensured that, for example during overload operation of power electronics components, the cover provides a cooling reserve by virtue of the fact that the heating forces a phase change of the phase change material. Said temperature of a phase change during the subsequent operation of the assembly however always lies below the temperature at which the cover softens. Said softening would otherwise also occur during operation, and would thus jeopardize the functioning of the assembly. A phase change material of said type therefore cannot on its own form the cover, but rather must be incorporated into a further material of the cover. This could for example be realized in the form of a cushion filled with the phase change material, wherein said cushion is embedded into the rest of the material of the cover. However, the phase change material can, during the mounting process, owing to its presence in the liquid phase, be used for tolerance compensation, and can also be plastically deformed in said state. Therefore, the mounting process can benefit from the use of the phase change material, even if the characteristics thereof are of significance primarily for the subsequent operation of the assembly.

Other embodiments provide a cover having an integrated contacting, in the form of conductor paths. The cover itself is composed of a thermally softenable or thermally hardenable material. The contacting structure on the inner side of the cover has contact surfaces which serve for the electrical connection to the substrate and to the component. The contacting structure in this case runs on the inner side of the cover, wherein said inner side runs such that the contact surfaces are arranged at different levels which, during the subsequent mounting, define the joining levels. One of said joining levels is, as already mentioned, provided by the surface of the substrate. Another joining level is defined by the top side of the component, where contact surfaces are provided for the contacting with the contacting structure. In an advantageous embodiment, the cover is of sandwich type of construction. Here, according to the invention, both the thermally softenable or thermally hardenable material and the contacting structure form layers in the sandwich. Said layers may, as already discussed, be composed of a thermoplastic material foil or of a hardenable prepreg, whereas the contacting structure may be formed for example by a metal foil or by a leadframe. The semifinished parts are thus substantially two-dimensional and can be suitably cut to size for the production of the cover. The three-dimensional structure of the cover is realized by stacking of the individual layers.

It may be advantageous if, in the cover, an additional material is applied to the contact surfaces of the contacting structure. Here, as already discussed, said additional material may be a high-temperature solder, a diffusion solder or a sintering material. Said additional materials are then, after the mounting of the cover on the assembly, available for forming the joining connections. Joining can be performed in the manner already discussed above.

It may also be advantageous if the support surface is formed by an edge of the cover. The cover is then placed with its edge onto the substrate. If the edge is of encircling form, it is the case when the cover is placed onto the substrate that a closed cavity is formed, which advantageously ensures protection of the assembly against contamination and other environmental influences. It is furthermore also possible for the contact surfaces or the contact surfaces equipped with the additional material to be provided on the edge of the cover, because contacting of the contacting structure with the substrate can be realized in this way.

It may also be advantageous if the outer side of the cover is planar. This yields the advantages, already discussed above, of simplified mounting, because the joining tool can have a planar and thus simple geometry and can also be used for different cover geometries (with planar outer side). It is self-evidently advantageous if the outer side of the cover is formed parallel to the support surface, because the substrate, if it is mounted in a horizontal position, can also be mounted by virtue of the mounting tools being applied horizontally.

The electrical component may be formed from silicon, silicon carbide, gallium arsenide or gallium nitride, for example. Said materials are preferably used for power electronics components. The substrate may for example be manufactured from a ceramic. This may be coated with copper, silver or gold, wherein the coating may be structured in order to form electrical contact surfaces and conductor tracks. As additional materials, it is possible, depending on the joining method, for high-temperature solders such as antimony-containing alloys or conventional solders with high lead content, diffusion solders of the material systems Sn—Cu, Sn—Cu—Ni, Sn—Cu—Ag, and preferably silver-containing sinter pastes or sinter foils to be used.

Figure 3:
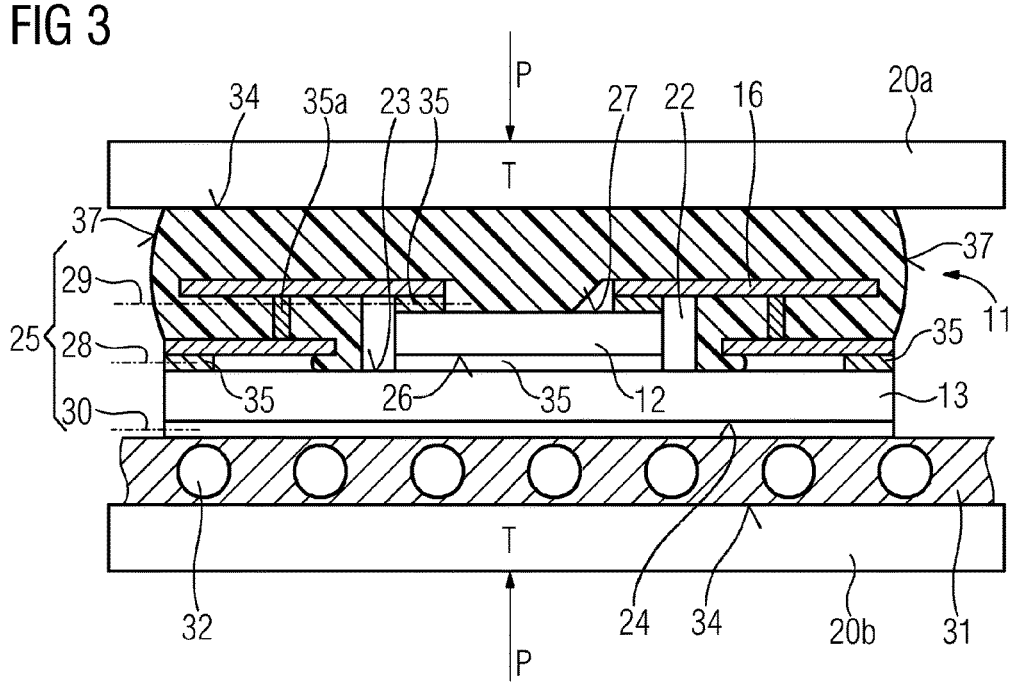

FIG. 1 illustrates a cover 11 which, as per FIG. 3, can be placed onto a substrate 13 equipped with an electrical component 12. The cover is composed of multiple layers which, together, form a sandwich structure. Layers 14 composed of a thermally hardenable prepreg material are provided, between which metallic layers 15 form a contacting structure 16. The contacting structure is thus integrated into the material of the cover. In this example, on the ends of the contacting structure 16, which provides contact surfaces for contact purposes, an additional material in the form of a diffusion solder is provided. The cover has an inner side 18 and an outer side 19, wherein the outer side 19 is of planar form in order that a joining tool 20a with a planar pressure surface can be mounted onto the outer side 19 of the cover 11 (cf. FIG. 3).

Figure 2:
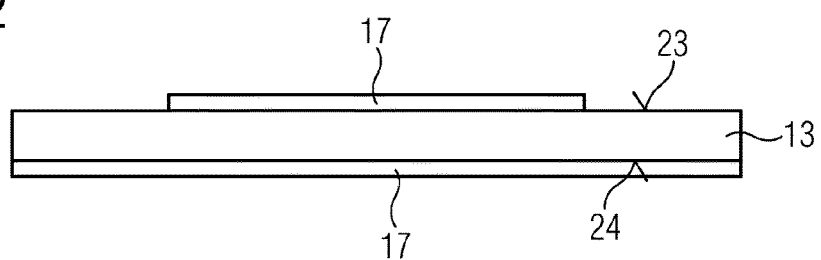
FIGS. 2 and 3 show further method steps of said exemplary embodiment of the method according to the invention in a side view, partially in section.

On the inner side 18 of the cover, there is also formed a support surface 21 which, in the section illustrated in FIG. 1, is provided by the additional material 17 on the outer edge of the cover. Where no additional material is provided, said support surface 21 may also be formed by a further layer (not illustrated) of the prepreg. The support surface serves, in a further method step, for being able to be placed directly onto the substrate. In this way, the interior of the cover can be sealed off with respect to the surroundings, such that a cavity 22 is formed in the interior (cf. FIGS. 3 and 4). FIG. 2 shows the substrate 13, which has a mounting side 23 and a rear side 24. Said substrate is a DCB ceramic substrate (not illustrated in any more detail), wherein the copper layers are not illustrated in any more detail. On the mounting side 23 and on the rear side 24 there are provided further regions with the additional material 17, where various joining partners are to be mounted at a later point in time (cf. FIG. 3). The copper layer (not illustrated) on the mounting side 23 is suitably structured in order that the component 12 to be mounted can be contacted in a suitable manner.

FIG. 3 illustrates how the electrical assembly to be mounted is designed. It can be seen that, on the mounting side 23 of the substrate 13, in the region of the additional material (cf. FIG. 2), the component 12 has been placed by way of its bottom side 26 onto the mounting side 23 of the substrate 13. Said component 12 has, on its top side 27, electrical contacts which are not illustrated in any more detail. The cover 11 as per FIG. 1 is placed onto the assembly thus formed composed of the substrate 13 and the component 12, wherein the contacting structures 16 come to lie by way of their ends and the additional material (cf. FIG. 1) against the top side 27 of the component 12 and against the mounting side 23 of the substrate 13. Here, it must be taken into consideration that the ends of the contacting structure 16 lie in each case at different levels, which in FIG. 3 are denoted as first joining level 28, predefined by the mounting side 23 of the substrate 13, and as second joining level 29, predefined by the top side 27 of the component 12. A third joining level 30 is provided by the bottom side 24 of the substrate 13. Said third joining level serves for the fastening of a base plate 31, which is designed as a cooling body and which, as a component part, is connected in thermally conductive fashion by way of the additional material (cf. FIG. 2) to the bottom side 24 of the substrate 13. For cooling purposes, it is for example possible for cooling ducts 32 to be provided in the base plate 23. The assembly as per figure has now been pre-mounted. That is to say, the individual components (base plate 31, substrate 13, component 12, contacting structure 16) have been positioned relative to one another in the configuration to be produced. The additional material 17 ensures that said configuration has sufficient stability for handling purposes during the further manufacturing process. For this purpose, it is also possible for joining aids (not illustrated in any more detail) to be provided. These may be composed for example of external tools such as for example clamps. It is also possible for joining aids such as for example clip connections, to be integrated (not illustrated) into the individual component parts. The retention of the individual components of the assembly by way of said joining aids is merely provisional until the final mounting of the assembly is performed.

As per FIG. 3, the two layers 15 composed of metal within the lower layer 14 of the prepreg are likewise connected by way of a molded piece of the additional material (cf. FIG. 1). This has the advantage that said two layers can also be reliably connected to one another during the joining process. A metallic connection 35a, for example a sintered connection, is therefore also produced between the two layers 15 during the joining process. Alternatively (not illustrated), it is also possible for the contacting structure 16 to be manufactured in one piece. However, the layers 14 composed of the prepreg must then be suitably cut to size in order that they can be laid in each case in front of and behind the vertically running parts of the contacting structure. Since the layers composed of the prepreg are elastic, it is possible here for certain undercuts to be overcome.

The final mounting is likewise indicated in FIG. 3. The assembly is placed into a suitable tool. Said tool is composed of joining tools 20a, 20b which are, from below and from above, moved against the assembly 25 to be completed. The joining tools have contact surfaces 34 by way of which a pressure force P can be exerted on the components to be joined. Said contact surfaces 34 are advantageously of planar form, which is realized in that both the base plate 31 and the cover 11 suitably provide planar contact surfaces for the joining tools 20a, 20b. It is thus possible for a heater (not illustrated in any more detail) by way of which the joining tools are brought to the temperature T, to transmit the heat to the assembly 25 over the entire contact surface 34. The heat in the joining tools may be realized, for example, by way of an electrical resistance heater (not illustrated). Together with the required pressure force P, the additional material (cf. FIG. 1) is converted into joining connections 35, 35a as per FIG. 3, such that, in this way, the assembly is permanently mounted.

At the same time as the realization of the joining connections 35, 35a, the material of the layers 14 composed of the prepreg is also hardened. It can be seen that said material is plastically deformed by the pressure P. Here, inter alia, the material sets down on the top side 27 of the component 12 and can generate a joining pressure there. Furthermore, gaps 36 (cf. FIG. 1) are closed, while the layers 14 of the prepreg connect to one another. Owing to the plastic deformation, a bulged outer side 37 of the cover 11 is also evident in FIG. 3. In this state, the prepreg material hardens while the joining connections 35 are simultaneously produced in one working step. The profile of the temperature T and of the pressure P during the joining process must allow both for the hardening times of the prepreg and for the conditions of the formation of the joining connections. Here, pressure P and temperature T do not imperatively need to be kept constant. It is also possible, for example, for the thermal conditions for the formation of the prepreg to firstly be realized, which are relatively low, and for the hardened prepreg to subsequently be used for providing the required pressure P for a subsequent sintering treatment. Here, if necessary, it is also possible for a temperature increase to be realized, because the hardened prepreg material now also remains mechanically stable even at relatively high temperatures.

Figure 4:
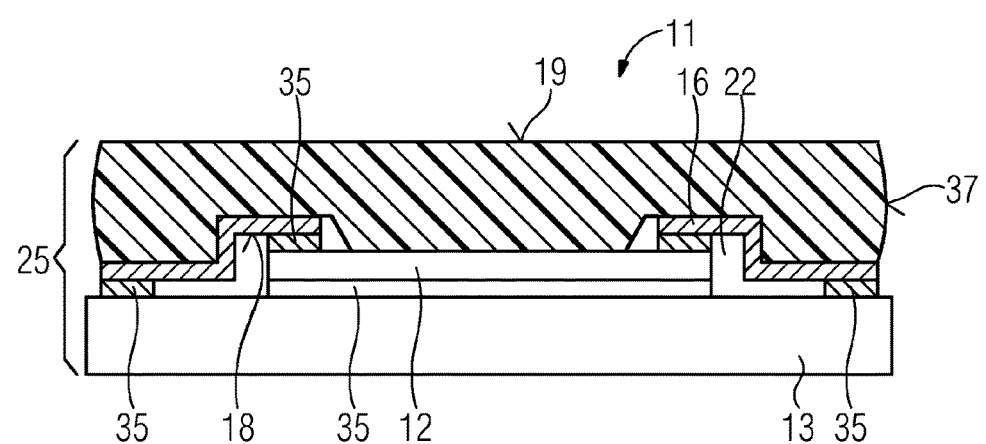
FIG. 4 shows an assembly, fully mounted with a cover according to another exemplary embodiment of the method according to the invention in a cross section.

FIG. 4 illustrates an alternatively designed assembly 25, specifically after the joining tools have been removed. Since the outer surface 19 and the surface of the base plate 31 are in each case of planar form, the joining tools 33 as per FIG. 3 can also be used for the electrical assembly 25 as per FIG. 4. The cover 11 as per FIG. 4 is however designed differently than the cover as per FIGS. 1 and 3. Said cover is composed of a thermoplastic plastics material. A contacting structure 16 in the form of a leadframe has been placed into the inner side 18 of the cover. After provisional fixing of the contacting structure, excess parts of the leadframe have already been cut off (not illustrated in any more detail). The contacting structures have likewise been provided with an additional material (analogously to FIGS. 1 and 2) which forms joining connections 35 in the assembly 25 as per FIG. 4.

It can also be seen in FIG. 4 that the outer side 37 of the cover is of bulged form. This can be attributed to the fact that the thermoplastic material has begun to flow during the joining process owing to the acting forces P (cf. FIG. 3). However, the temperatures required for the joining were coordinated with the temperature range of the softening of the thermoplastic material of the cover 11 such that said flow process took place only slowly, and thus sufficient mechanical stability of the thermoplastic material was maintained in order for it to be possible for the joining force P to be transmitted to the joining connections 35 that were forming. The creep of the thermoplastic material must furthermore be so slow that the joining pressure can be maintained over the entire time period of the joining process.

What is claimed is:

1. A method for mounting an electrical component on a substrate, wherein the component has a bottom side facing toward the substrate and a top side situated opposite said bottom side, the method comprising:
   mounting the electrical component onto the substrate,
   forming a cover including integrated conductor paths that define a contacting structure,
   wherein the cover comprises a composite material having fibers and a matrix, the matrix comprising a thermosetting resin not yet fully hardened,
   mounting the cover onto a mounting side of the substrate and onto the top side of electrical component mounted on the substrate while the cover is not yet fully hardened, such that:
   the cover traverses the electrical component in a lateral direction, first contact surfaces of the contacting structure laterally outside the electrical component engage with the substrate at a first joining level defined at the mounting side of the substrate, and second contact surfaces of the contacting structure engage with the electrical component at a second joining level defined at the top side of the electrical component, the second joining level being different than the first joining level, and heating the material of the cover into a temperature range sufficient to fully harden the thermosetting resin after the cover has been mounted to the substrate and the electrical component, wherein the top side of the electrical component is connected to the mounting side of the substrate via the contacting structure.

2. The method of claim 1, comprising, after mounting the electrical component to the substrate and mounting the cover onto the substrate and the electrical component, performing a temperature or pressure based joining process to complete joining connections between the cover and the electrical component at the first joining level and between the cover and the substrate at the second joining level.

3. The method of claim 2, wherein hardening the thermosetting resin of the cover and the completion of the joining connections are performed in one and the same process under the same conditions.

4. The method of claim 2, comprising mounting a rear side of the substrate, opposite the mounting side, to a component part at a third joining level, and completing a joining connection between the substrate and the component part at the third joining level, simultaneous with the completion of the joining connections at the first and second joining levels, via the temperature or pressure based joining process.

5. The method of claim 1, wherein the cover has a planar outer surface that runs parallel to the substrate.

6. The method of claim 1, wherein the cover comprises a phase change material with a phase change temperature above an operating temperature of the component.

7. The method of claim 6, wherein the phase change material is enclosed in an encapsulation.

8. A cover for an electrical assembly that includes a substrate and at least one component mounted on the substrate, the cover comprising:

a support surface on an inner side of the cover and configured to engage the substrate upon mounting the cover onto the substrate, a cavity configured to receive the component upon mounting the cover onto the substrate, conductor paths defining a contacting structure integrated in the cover, wherein the cover comprises a composite material having fibers and matrix, the matrix comprising a thermosetting resin not fully hardened until the cover is mounted onto the substrate, and wherein the support surface includes surface portions of the contacting structure that define contact surfaces that engage the substrate and the component upon mounting of the cover onto the substrate.

9. The cover of claim 8, wherein the cover has a sandwich type of construction, wherein both the composite material of the cover and the contacting structure form layers of the sandwich.

10. The cover of claim 8, comprising an additional material applied, in the cover, to the contact surfaces of the contact structure.

11. The cover of claim 8, wherein the support surface is formed by an edge of the cover.

12. The cover of claim 8, wherein an outer surface of the cover is planar.

* * * * *